(12) United States Patent
Lin

(10) Patent No.: US 9,101,210 B2
(45) Date of Patent: Aug. 11, 2015

(54) TRACK TYPE SUPPORTING MECHANISM AND SUPPORTING SYSTEM

(75) Inventor: Cheng-Hsuan Lin, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 210 days.

(21) Appl. No.: 13/284,995

(22) Filed: Oct. 31, 2011

(65) Prior Publication Data

US 2012/0132760 A1    May 31, 2012

(30) Foreign Application Priority Data

Nov. 30, 2010  (TW) .............................. 099141631 A

(51) Int. Cl.
| | |
|---|---|
| A47B 53/00 | (2006.01) |
| A47B 53/02 | (2006.01) |
| F16M 11/20 | (2006.01) |
| H05K 7/14 | (2006.01) |
| H05K 7/18 | (2006.01) |
| H05K 7/20 | (2006.01) |
| F16M 1/00 | (2006.01) |

(52) U.S. Cl.
CPC ................. *A47B 53/00* (2013.01); *A47B 53/02* (2013.01); *F16M 1/00* (2013.01); *F16M 11/20* (2013.01); *H05K 7/14* (2013.01); *H05K 7/18* (2013.01); *H05K 7/20* (2013.01)

(58) Field of Classification Search
CPC ........... F16M 11/20; H05K 7/14; H05K 7/18; H05K 7/20; A47B 53/00; A47B 53/02
USPC .................... 248/657; 361/724, 727, 726, 725
See application file for complete search history.

(56) References Cited

U.S. PATENT DOCUMENTS

| | | | | |
|---|---|---|---|---|
| 2,895,087 A * | 7/1959 | Lieb et al. | ...................... | 361/724 |
| 3,335,326 A * | 8/1967 | Bonin et al. | ................... | 361/827 |
| 3,689,128 A * | 9/1972 | Andreini et al. | ............... | 312/287 |
| 4,307,922 A * | 12/1981 | Rhodes, Jr. | ................... | 312/198 |
| 4,417,524 A * | 11/1983 | Quinn et al. | ................... | 105/101 |
| 4,919,384 A * | 4/1990 | Grimberg | ....................... | 248/646 |
| 5,287,546 A * | 2/1994 | Tesic et al. | ....................... | 378/54 |
| 5,386,453 A * | 1/1995 | Harrawood et al. | .......... | 378/196 |
| 5,483,960 A * | 1/1996 | Steiger et al. | ................. | 600/425 |
| 5,598,934 A * | 2/1997 | Krummell et al. | ............ | 211/151 |
| 5,687,211 A * | 11/1997 | Berger et al. | ................. | 378/196 |
| 5,715,820 A * | 2/1998 | Stein et al. | ..................... | 600/407 |

(Continued)

FOREIGN PATENT DOCUMENTS

| | | |
|---|---|---|
| TW | M262638 | 4/2005 |
| TW | M385619 | 8/2010 |

OTHER PUBLICATIONS

Office action mailed on Nov. 19, 2012 for the Taiwan application No. 099141631, p. 2 line 7-26 and p. 3 line 1-9.

*Primary Examiner* — Terrell McKinnon
*Assistant Examiner* — Eret McNichols
(74) *Attorney, Agent, or Firm* — Winston Hsu; Scott Margo

(57) ABSTRACT

A track type supporting mechanism for supporting at least one machine is disclosed in the present invention. The track type supporting mechanism includes a base, at least one linear guideway disposed on the base, at least one sliding block slidably disposed on the at least one linear guideway, and at least one supporting platform disposed on the at least one sliding block for supporting the at least one machine, so that the at least one machine slides relative to the base via the at least one linear guideway and the at least one sliding block.

18 Claims, 8 Drawing Sheets

(56) References Cited

U.S. PATENT DOCUMENTS

| | | | |
|---|---|---|---|
| 5,717,735 A * | 2/1998 | Ramsdell et al. | 378/208 |
| 5,748,705 A * | 5/1998 | Stein et al. | 378/196 |
| 5,778,045 A * | 7/1998 | von Stetten et al. | 378/98.9 |
| 6,009,147 A * | 12/1999 | Stein et al. | 378/196 |
| 6,027,190 A * | 2/2000 | Stewart et al. | 312/201 |
| 6,160,866 A * | 12/2000 | Mazess et al. | 378/56 |
| 6,217,214 B1 * | 4/2001 | Cabral et al. | 378/196 |
| 6,231,138 B1 * | 5/2001 | Janson | 312/201 |
| 6,526,702 B2 * | 3/2003 | Jones | 52/64 |
| 6,621,692 B1 * | 9/2003 | Johnson et al. | 361/679.55 |
| 7,587,983 B2 * | 9/2009 | Parker et al. | 105/30 |
| 8,335,075 B2 * | 12/2012 | Zhang | 361/679.33 |
| 8,335,076 B2 * | 12/2012 | Zhang | 361/679.37 |
| 8,339,781 B2 * | 12/2012 | Zhang | 361/679.39 |
| 8,567,883 B2 * | 10/2013 | Hsiao | 312/249.8 |
| 8,607,996 B2 * | 12/2013 | Yang | 211/162 |
| 2004/0065224 A1 * | 4/2004 | Gilbert et al. | 104/137 |
| 2004/0104647 A1 * | 6/2004 | Nemec et al. | 312/201 |
| 2005/0035694 A1 * | 2/2005 | Stevens | 312/201 |
| 2005/0274850 A1 * | 12/2005 | Blase et al. | 248/65 |
| 2008/0060790 A1 * | 3/2008 | Yates et al. | 165/80.3 |
| 2009/0229194 A1 * | 9/2009 | Armillas | 52/79.1 |
| 2011/0215064 A1 * | 9/2011 | Parker et al. | 211/183 |
| 2011/0284711 A1 * | 11/2011 | Hsiao | 248/346.03 |
| 2013/0107448 A1 * | 5/2013 | Hamburgen et al. | 361/679.47 |
| 2014/0139080 A1 * | 5/2014 | Pan | 312/201 |

* cited by examiner

TRACK TYPE SUPPORTING MECHANISM AND SUPPORTING SYSTEM

BACKGROUND OF THE INVENTION

1. Field of the Invention

The present invention relates to a supporting mechanism for supporting a machine, and more particularly, to a track type supporting mechanism utilizing a linear guideway to support a machine and a related supporting system.

2. Description of the Prior Art

For supporting heavy machines, such as severs and coolers, a conventional supporting mechanism utilizes a roller structure to move the machines within a limited range, so that an operator can control and fix operating panels disposed on each sides of the machines conveniently. Rollers of the conventional roller structure are damaged easily due to high loading of the machines, the damaged rollers cause noise and vibration, and stability and precision of the supporting mechanism are affected. Therefore, design of a supporting mechanism not being damaged by high loading is an important issue in mechanical industry.

SUMMARY OF THE INVENTION

An objective of the present invention is to provide a track type supporting mechanism utilizing a linear guideway to support a machine for solving above drawbacks.

Another objective of the present invention is to provide a supporting system, and the supporting system has the track type supporting mechanism utilizing the linear guideway to support a machine.

In order to achieve the foregoing objectives of the invention, the track type supporting mechanism includes a base, at least one linear guideway disposed on the base, at least one sliding block slidably disposed on the at least one linear guideway, and at least one supporting platform disposed on the at least one sliding block, so that the at least one supporting platform slides relative to the base via the at least one linear guideway and the at least one sliding block. The at least one supporting platform is for supporting at least one machine.

According to the claimed invention, the base includes a contacting component, the supporting platform includes two constraining components, and the contacting component is for contacting against the two constraining components, so as to constrain the supporting platform relative to the base between the two constraining components.

According to the claimed invention, the supporting mechanism further includes at least one accommodating slot disposed on the base, and a plurality of slabs detachably disposed on the at least one accommodating slot. A height of the plurality of slabs is lower than a height of the at least one supporting platform.

According to the claimed invention, the supporting mechanism further includes at least one concave disposed on the plurality of slabs, and a positioning structure disposed on the at least one supporting platform. The positioning structure includes a main body, and a positioning protrusion movably disposed on the main body. The positioning protrusion is for engaging with the concave so as to constrain the at least one supporting platform relative to the plurality of slabs.

According to the claimed invention, the supporting mechanism further includes at least one concave disposed on the base, and a positioning structure disposed on the at least one supporting platform. The positioning structure includes a main body, and a positioning protrusion movably disposed on the main body. The positioning protrusion is for engaging with the concave so as to constrain the at least one supporting platform relative to the base.

In order to achieve another foregoing objectives of the invention, the supporting system includes at least one machine, and a plurality of supporting mechanisms for supporting the at least one machine. Each of the plurality of supporting mechanisms includes a base, at least one linear guideway disposed on the base, at least one sliding block slidably disposed on the at least one linear guideway, and at least one supporting platform disposed on the at least one sliding block, so that the at least one supporting platform slides relative to the base via the at least one linear guideway and the at least one sliding block. The at least one supporting platform is for supporting the at least one machine.

According to the claimed invention, the supporting system further includes a wiring channel disposed on a side of the supporting mechanism.

According to the claimed invention, the supporting system further includes a chain structure, two ends of the chain structure being respectively connected to the supporting platform and the wiring channel, and an accommodating space is formed inside the chain structure.

The supporting system of the present invention can support a heavy machine, and the supporting mechanism having the linear guideway can be utilized to slide the machine relative to the base, so as to increase operating convenience of the supporting system. In addition, the supporting system can utilize the buffer to absorb the vibration and utilize the positioning structure to lock the supporting platform, so that the supporting system of the present invention can be applied on the mobile container supporting system.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
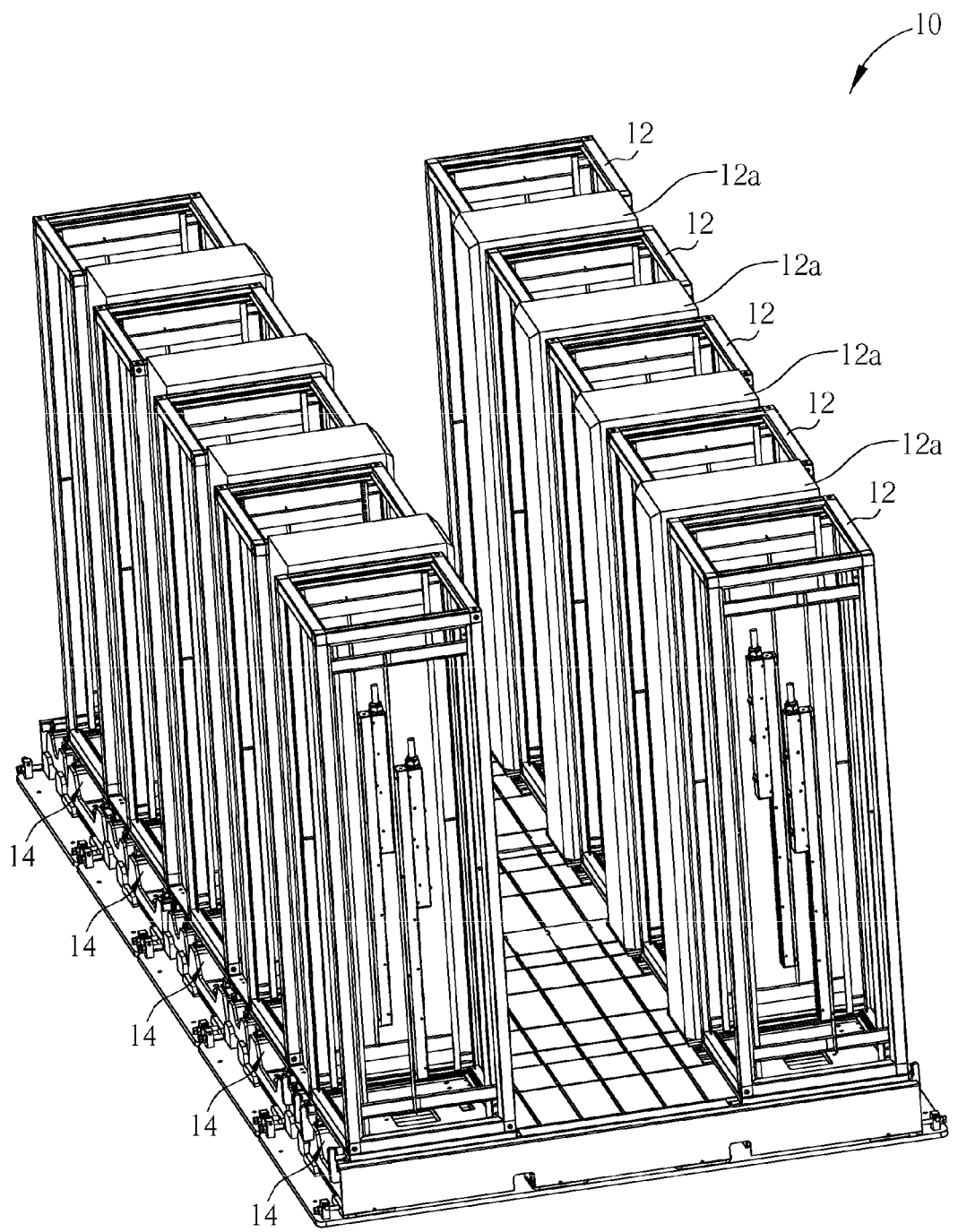
FIG. 1 is a schematic diagram of a supporting system according to an embodiment of the present invention.

Please refer to FIG. 1. FIG. 1 is a schematic diagram of a supporting system 10 according to an embodiment of the present invention. The supporting system 10 includes a plurality of machines 12 and a plurality of supporting mechanisms 14. The plurality of supporting mechanisms 14 is for supporting the plurality of machines 12. In the embodiment, the supporting system 10 can be utilized for a mobile container server system, the plurality of machines 12 can be servers and coolers, and the servers and the coolers can be alternately disposed on the plurality of supporting mechanisms 14, so that the coolers can dissipate heat generated by the adjacent severs.

As shown in FIG. 1, the supporting system 10 includes nine adjacent supporting mechanisms 14. In the embodiment, the machine 12 is the server, and the machine 12a is the cooler. The amount of the supporting mechanisms 12 and disposition of the machines of the supporting system 10 are not limited to the above-mentioned embodiment, and depend on actual demand.

The machines 12 and the supporting mechanisms 14 can be disposed inside a mobile container. Flat part of the supporting mechanism 14 can be a floor of the mobile container, and the plurality of machines 12 (such as the servers and the coolers) are alternately disposed on the supporting mechanisms 14 and located on two sides of the mobile container (as shown in FIG. 1). In the embodiment, the supporting system 10 is the supporting system of the mobile container server.

Figure 2:
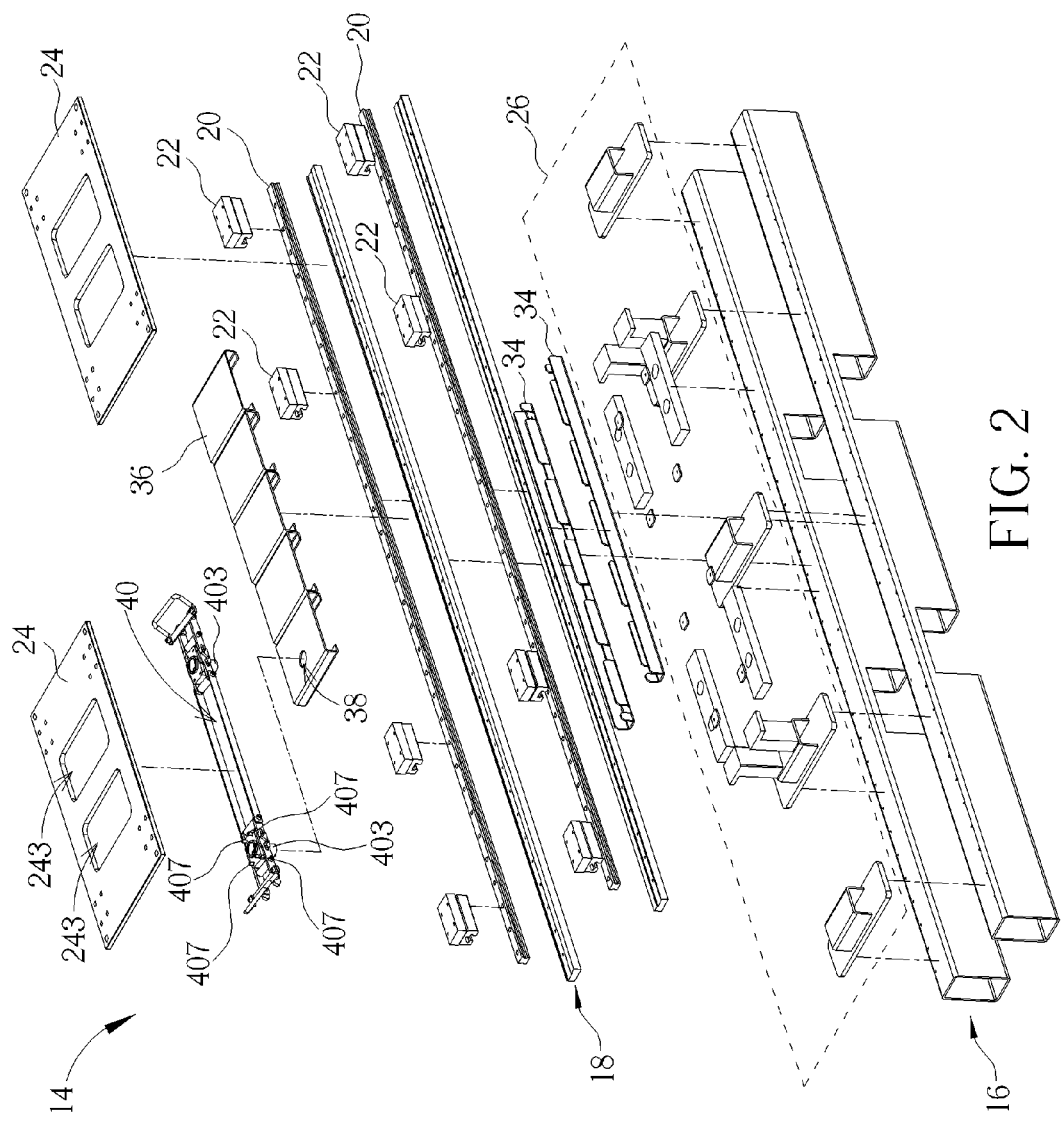
FIG. 2 is an exploded diagram of a supporting mechanism according to the embodiment of the present invention.
Figure 3:
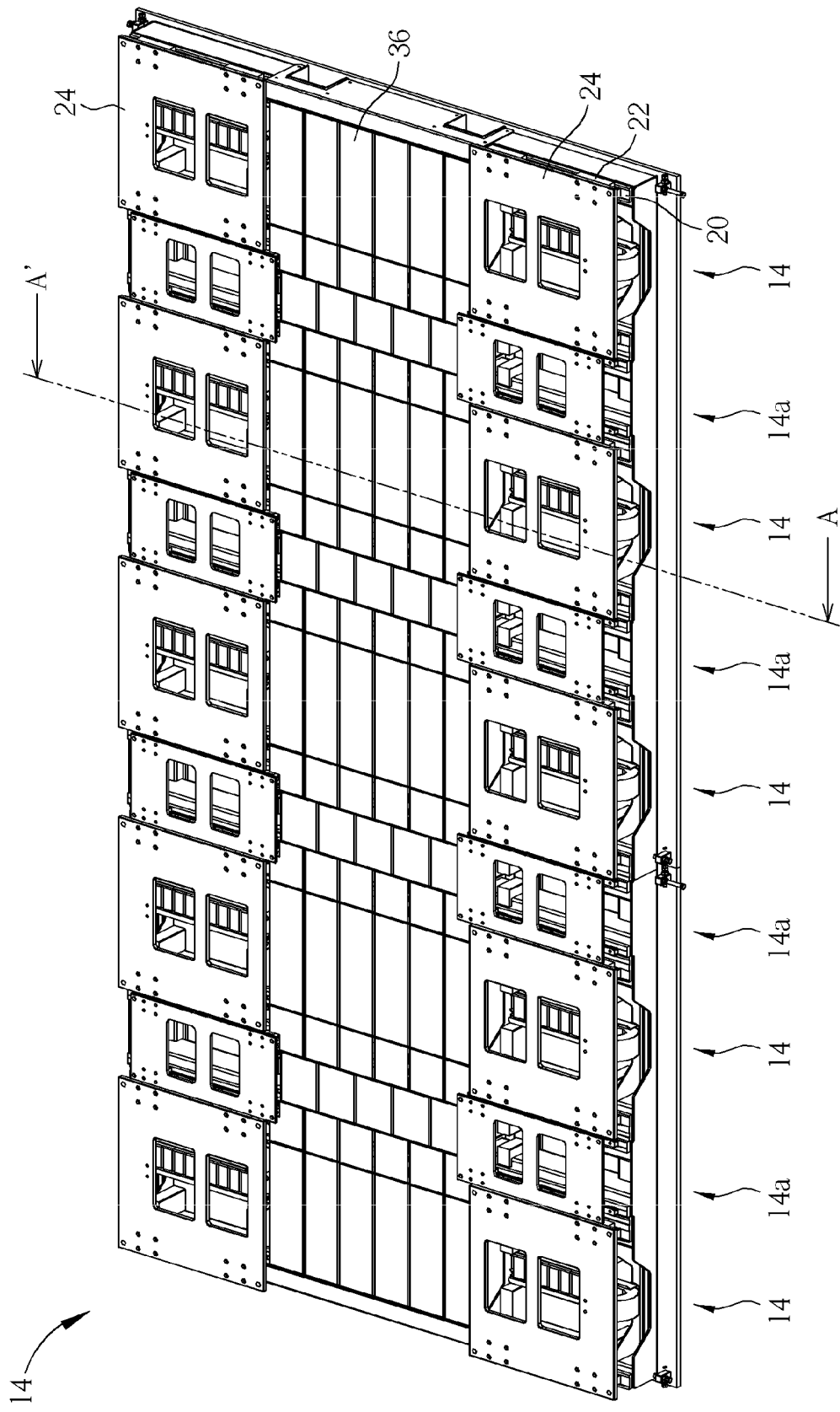
FIG. 3 is an assembly diagram of the nine supporting mechanisms according to the embodiment of the present invention.

Please refer to FIG. 2 and FIG. 3. FIG. 2 is an exploded diagram of the supporting mechanism 14 according to the embodiment of the present invention. FIG. 3 is an assembly diagram of the nine supporting mechanisms 14 according to the embodiment of the present invention. The supporting mechanism 14 includes a base 16, at least one linear guideway 20, at least one guiding block 22, and at least one supporting platform 24. In the embodiment, the supporting mechanism 14 has two linear guideways 20, four sliding blocks 22, and one supporting platform 24. It should be mentioned that amounts of the linear guideway 20, the sliding block 22 and the supporting platform 24 are not limited to the above-mentioned embodiment, and depend on actual demand.

The linear guideway 20 is stably disposed on the base 16. The linear guideway 20 can be installed on the base 16 via a fixing stand 18. On the other hand, the linear guideway 20 can be directly installed on the base 16 without the fixing stand 18.

The sliding block 22 can be slidably disposed on the linear guideway 20. In the embodiment, the four sliding blocks 22 of the supporting mechanism 14 slide on the two linear guideways 20.

The supporting platform 24 is disposed on the sliding block 22. In the embodiment, the supporting platform 24 is disposed on the four sliding blocks 22 (as shown in FIG. 2). The four sliding blocks 22 are respectively located at four corners of the supporting platform 24 for holding the supporting platform 24 stably. The supporting platform 24 is for supporting the machine 12, and the supporting platform 24 can slide relative to the base 16 via the linear guideway 20 and the sliding block 22.

As shown in FIG. 3, each supporting platform 24 of the supporting mechanism 14 is respectively for supporting the machine 12, and the two machines 12 are disposed on the two linear guideways 20. For sliding the machine 12 on the linear guideways 20 smoothly, the two linear guideways 20 are disposed in parallel. In the embodiment, the supporting mechanism 14 includes a holding structure 26 disposed on a side of the base 16. The holding structure 26 is disposed between the two parallel bases 16, so as to keep the two bases 16 in parallel arrangement.

It should be mentioned that dimensions of components of the supporting mechanism 14 can be adjusted according to dimensions of the machine 12. For example, dimensions and loading capability of the supporting mechanism 14 for supporting the server is greater than dimensions and loading capability of the supporting mechanism 14a for supporting the cooler due to volume difference and weight difference between the server and the cooler.

Figure 4:
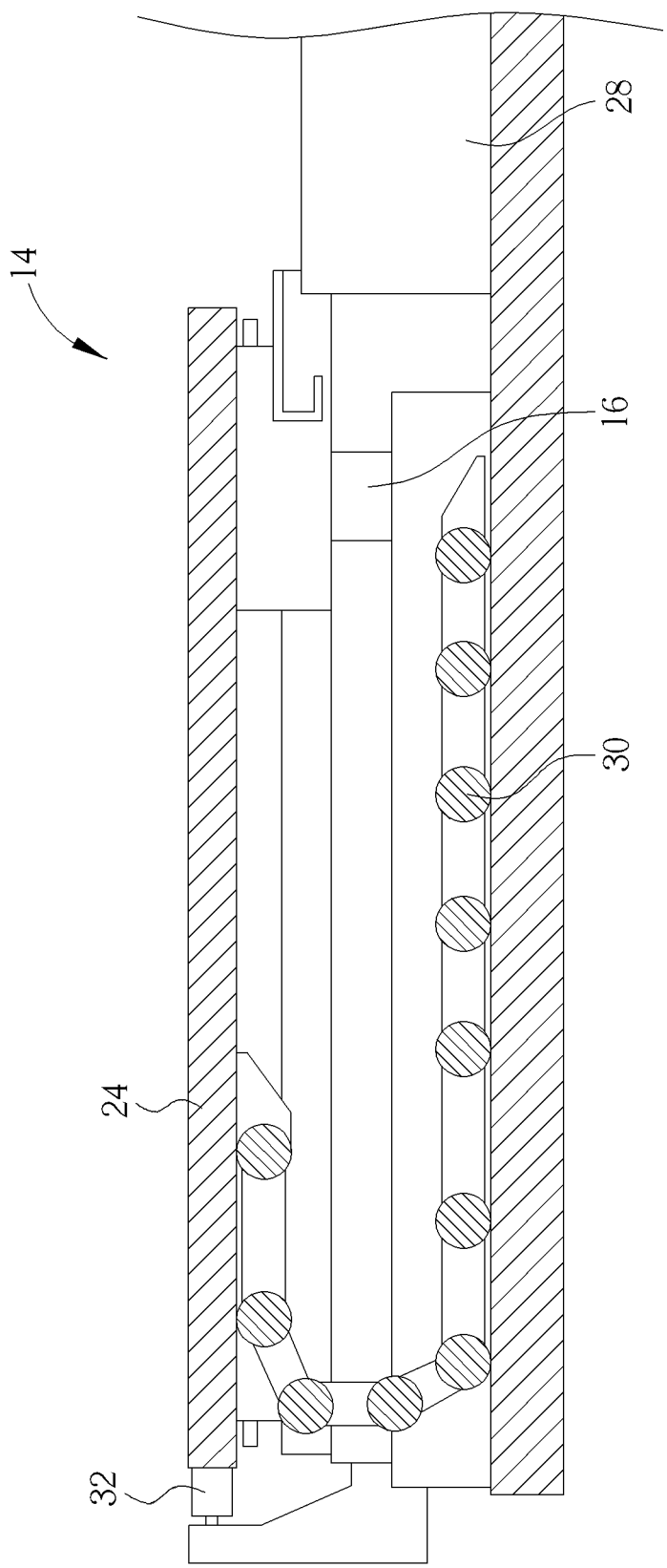
FIG. 4 is a cross-sectional view of the supporting mechanism along line A-A' shown in FIG. 3.
Figure 5:
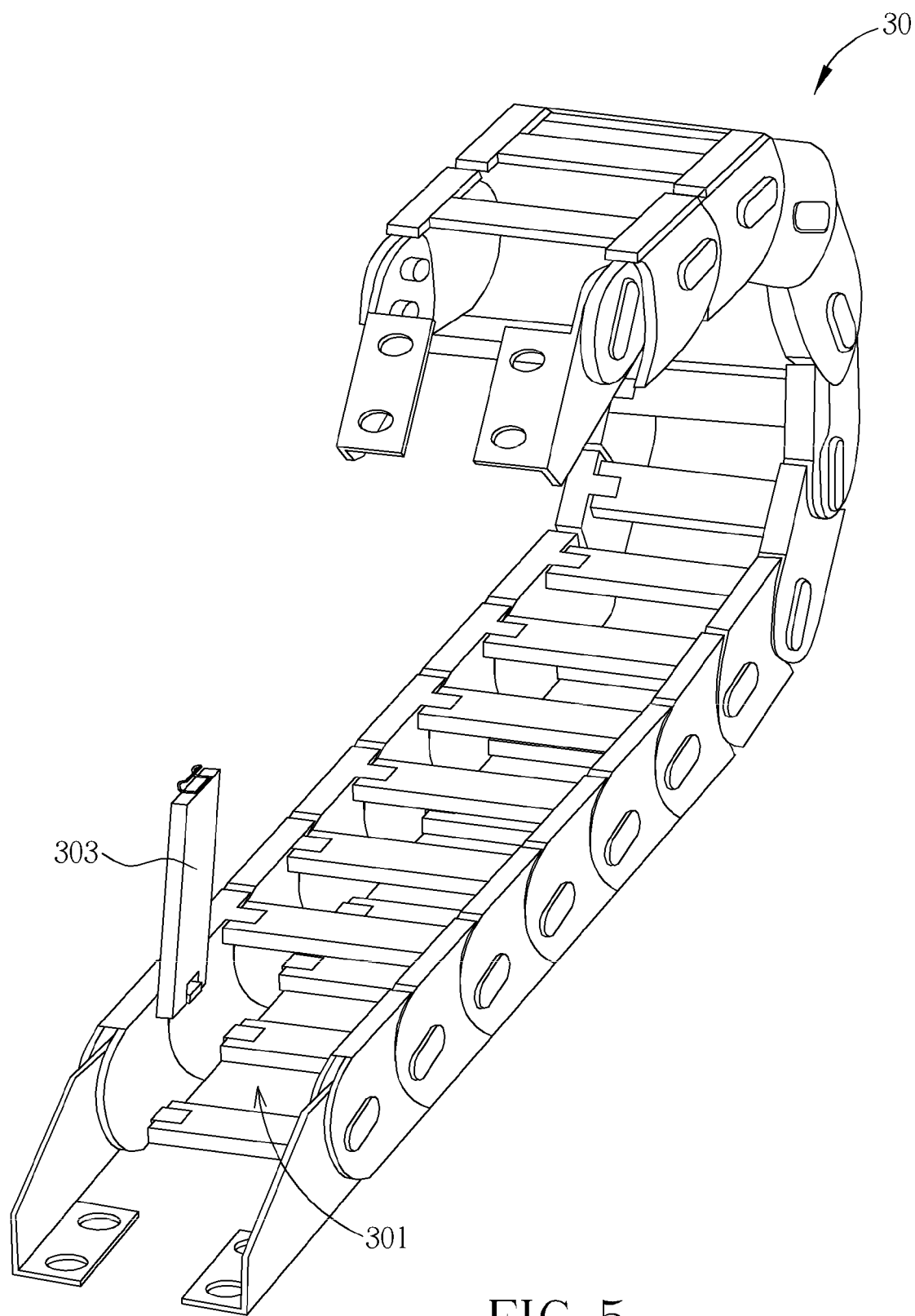
FIG. 5 is a diagram of a chain structure according to the embodiment of the present invention.

Please refer to FIG. 1 to FIG. 5. FIG. 4 is a cross-sectional view of a part of the supporting mechanism 14 along line A-A' shown in FIG. 3. FIG. 5 is a diagram of a chain structure 30 according to the embodiment of the present invention. In the embodiment, the supporting system 10 further includes a wiring channel 28 and the chain structure 30. The wiring channel 28 is disposed on a side of the base 16 of the supporting mechanism 14. Two ends of the chain structure 30 are respectively connected to the supporting platform 24 and the wiring channel 28. The plurality of machines 12 of the supporting mechanism 14 can be electrically connected to an external electronic device via cables disposed inside the wiring channel 28, respectively. The chain structure 30 is for covering the cables, so as to protect the cables from being damaged when the machine 12 slides relative to the base 16 of the supporting mechanism 14.

As shown in FIG. 5, an accommodating space 301 is formed inside the chain structure 30 for containing the cables. The chain structure 30 can include a plurality of detachable covers 303 for constraining the cables inside the accommodating space 301. It should be mentioned that the type of the chain structure 30 is not limited to the above-mentioned embodiment, and depends on actual demand.

The supporting mechanism 14 can further include a buffer 32 (as shown in FIG. 4) disposed on an end of the linear guideway 20. The buffer 32 is for absorbing vibration of the supporting platform 24 as hitting an end of the linear guideway 20 and for providing cushioning function to the supporting platform 24.

Figure 6:
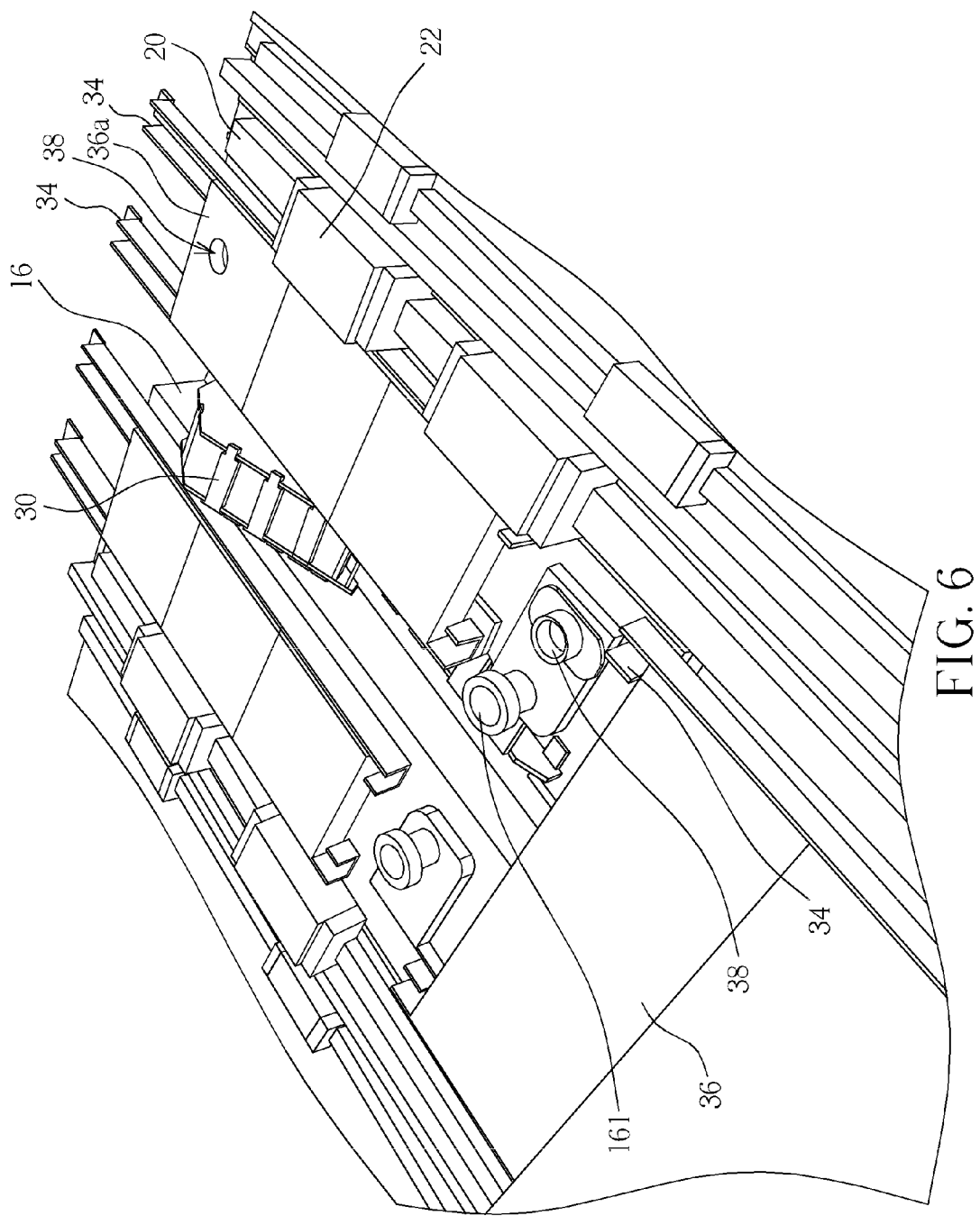
FIG. 6 is a diagram of the supporting mechanism in another view according to the embodiment of the present invention.

Please refer to FIG. 2, FIG. 3 and FIG. 6. FIG. 6 is a diagram of the supporting mechanism 14 in another view according to the embodiment of the present invention. In the embodiment, the supporting mechanism 14 can further include two accommodating slots 34 and a plurality of slabs 36. The two accommodating slots 34 are disposed on the base 16, and the plurality of slabs 36 is detachably disposed on the two accommodating slots 34. The slab 36 of the supporting mechanism 14 can be a protecting floor for covering the base 16, so as to protect components of the supporting mechanism 14. In addition, an operator can step on the slab 36 of the supporting mechanism 14 for maintaining the machine 12. Thus, the slab 36 not only can be the protection for covering the components of the supporting mechanism 14, but also can be stepped by the operator.

It should be mentioned that a height of the slab 36 is lower than a height of the supporting platform 24, and the slab 36 can not slide when being fixed on the accommodating slot 34. Therefore, the supporting platform 24 can pass over the slab 36 without interference when the supporting platform 24 slides relative to the base 16 via the linear guideway 20 and the sliding block 22.

The slab 36 can be a detachable slab with various dimensions according to actual demand. For example, the large size slab 36 can be disposed on central section of the base 16 for being stepped by the operator, and the small size slab 36a can be disposed on two ends of the base 16 for protecting the components of the supporting mechanism 14 and for being stepped by the operator when the supporting platform 24 is moved to the central section of the base 16.

Figure 7:
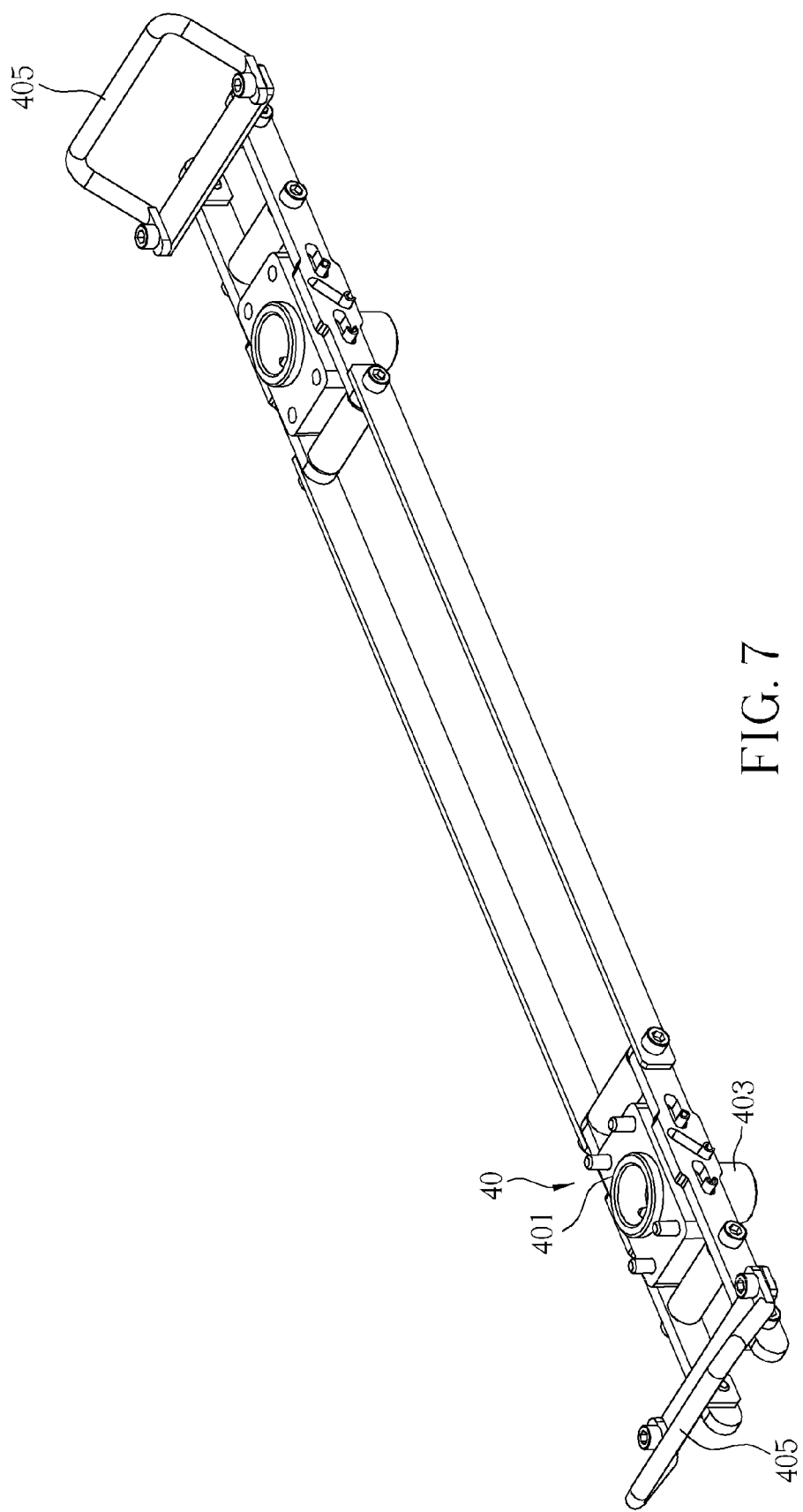
FIG. 7 is a diagram of a positioning structure of the supporting mechanism according to the embodiment of the present invention.

Please refer to FIG. 7. FIG. 7 is a diagram of a positioning structure 40 of the supporting mechanism 14 according to the embodiment of the present invention. As shown in FIG. 6 and FIG. 7, the supporting mechanism 14 further includes two concaves 38 and the positioning structure 40. The two concaves 38 can be respectively disposed on the base 16 (not shown in FIGS) and the slab 36 (as shown in FIG. 6). It should be mentioned that the concaves 38 can be both disposed on the base 16 via a plate or both disposed above the base 16 via the slab.

The positioning structure 40 is disposed on the supporting platform 24. The positioning structure 40 includes a main body 401 and a positioning protrusion 403. The positioning protrusion 403 is movably disposed on the main body 401. When the supporting platform 24 slides relative to the slab 36 at a predetermined position, a position of the positioning protrusion 403 corresponds to a position of the concave 38. The positioning protrusion 403 is for engaging with the concave 38, so as to constrain the supporting platform 24 relative to the base 36. In the embodiment, the protrusions 403 can be respectively engaged with the concave 38 on the base 16 and the concave 38 on the slab 36 simultaneously when the protrusion 403 protrudes from the main body 401.

The positioning structure 40 further includes a handle 405 connected to the main body 401. When the positioning protrusion 403 is not engaged with the concave 38, the handle 405 can be pulled for sliding the supporting platform 24 relative to the base 16 (or the slab 36), so as to adjust a position of the machine 12 relative to the linear guideway 20.

Figure 8:
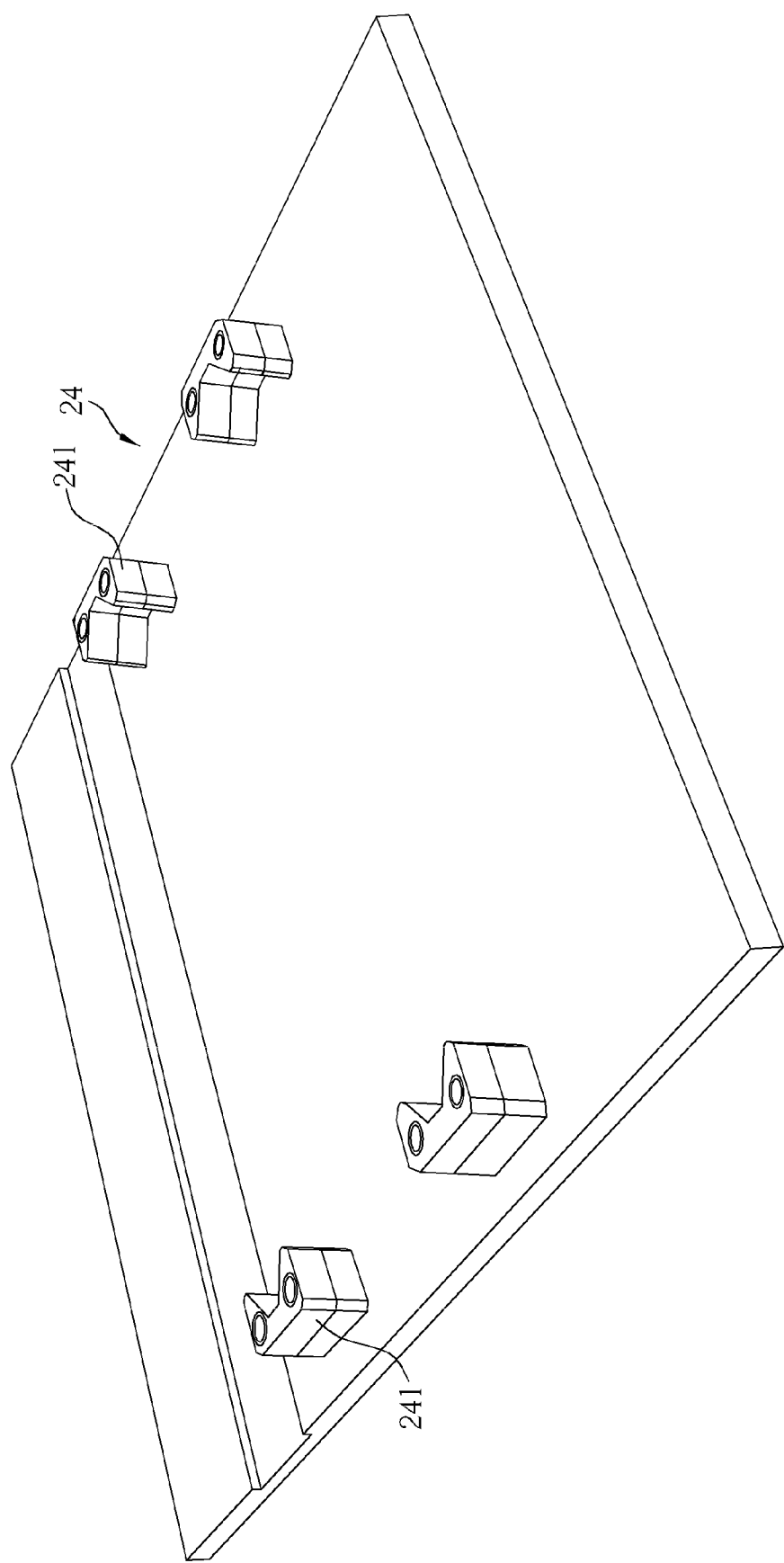
FIG. 8 is a diagram of a supporting platform of the supporting mechanism in another view according to the embodiment of the present invention.

Please refer to FIG. 8. FIG. 8 is a diagram of the supporting platform 24 of the supporting mechanism 14 in another view according to the embodiment of the present invention. As shown in FIG. 6 to FIG. 8, the base 16 includes at least one contacting component 161, and the supporting platform 24 includes two constraining components 241. For example, the contacting component 161 can be covered by resilient material, such as rubber, for cushioning impact of the constraining component 241. When the supporting platform 24 is moved relative to the base 16 via the linear guideway 20 and the sliding block 22, the contacting component 161 can be for contacting against the two constraining components 241, so as to constrain the supporting platform 24 to slide relative to the base 16 between the two constraining components 241. A distance between the two constraining components 241 can be a distance from an end of the linear guideway 20 to a center of the linear guideway 20, which means that the two constraining components 241 can constrain the supporting platform 24 to slide during a limited range with the positioning structure 40.

In conclusion, the supporting system 10 of the present invention utilizes the supporting mechanisms 14 and 14a having the linear guideways 20 to support the machines 12 and 12a. The machines 12 and 12a can be held by the supporting mechanisms 14 and 14a stably and continuously without damage due to advantages of low frictional coefficient, low noise and great loading capacity of the linear guideway 20. In addition, the buffer 32 of the supporting system 10 can absorb vibration generated as the supporting platform 24 slides to the end of the base 16, so as to protect the machines 12 and 12a. Furthermore, the supporting system 10 can utilize the contacting component 161 of the base 16 and the constraining component 241 of the supporting platform 24 to constrain the supporting platform 24 to slide relative to the base 16 with the positioning structure 40.

Comparing to the prior art, heavy machine can be supported by the supporting system of the present invention stably, and the supporting mechanism having the linear guideway can be utilized to slide the machine relative to the base, so as to increase operating convenience of the supporting system. In addition, the supporting system can utilize the buffer to absorb the vibration, and utilizes the positioning structure to lock the supporting platform, so that the supporting system of the present invention can be applied on the mobile container supporting system.

Those skilled in the art will readily observe that numerous modifications and alterations of the device and method may be made while retaining the teachings of the invention.

What is claimed is:

1. A supporting mechanism comprising:
    a base;
    two linear guideways disposed on the base, each of the linear guideways having an upper contacting surface and a plurality of lateral contacting surfaces, the lateral contacting surfaces being connected to sides of the upper contacting surface;
    a plurality of sliding blocks slidably disposed on the corresponding linear guideways, wherein each of the plurality of sliding blocks is a sunken structure, each sliding block being engaged with the corresponding linear guideway as inner walls of the corresponding sunken structure movably surround and contact the upper contacting surface and the plurality of lateral contacting surfaces of the corresponding linear guideway;
    at least one supporting platform disposed on the plurality of sliding blocks, so that the at least one supporting platform slides relative to the base via the two linear guideways and the plurality of sliding blocks, and the at least one supporting platform being for supporting at least one machine;
    at least one accommodating slot structure disposed on the base and located between the two linear guideways;
    a plurality of slabs detachably disposed on the at least one accommodating slot structure and separated from the at least one supporting platform, wherein support surfaces of the at least one supporting platform and the plurality of slabs are parallel with each other;
    at least one concave directly disposed on one of the plurality of slabs; and
    a positioning structure disposed on the at least one supporting platform, the positioning structure comprising:
        a main body; and
        a positioning protrusion movably disposed on the main body, the positioning protrusion being for engaging with the concave so as to constrain a movement of the at least one supporting platform relative to the plurality of slabs.

2. The supporting mechanism of claim 1, wherein a height of the plurality of slabs is lower than a height of the at least one supporting platform.

3. The supporting mechanism of claim 1, wherein the positioning structure further comprises a handle connected to the main body.

4. The supporting mechanism of claim 1, wherein the base comprises a contacting component, the supporting platform comprises two constraining components, and the contacting component is for contacting against the two constraining components.

5. The supporting mechanism of claim 4, further comprising:
    a buffer disposed on an end of the linear guideway, the buffer being for providing cushioning function to the supporting platform.

6. The supporting mechanism of claim 5, further comprising:
    a holding structure disposed on a side of the base, the holding structure being for holding the base.

7. The supporting mechanism of claim 6, further comprising:

a fixing stand disposed between the linear guideway and the base, the fixing stand being for fixing the linear guideway.

8. A supporting system comprising:
at least one machine; and
a plurality of supporting mechanisms for supporting the at least one machine, each of the plurality of supporting mechanisms comprising:
a base;
two linear guideways disposed on the base, each of the linear guideways having an upper contacting surface and a plurality of lateral contacting surfaces, the lateral contacting surfaces being connected to sides of the upper contacting surface;
a plurality of sliding blocks slidably disposed on the corresponding linear guideways, wherein each of the plurality of sliding blocks is a sunken structure, each sliding block being engaged with the corresponding linear guideway as inner walls of the corresponding sunken structure movably surround and contact the upper contacting surface and the lateral contacting surfaces of the corresponding linear guideway;
at least one supporting platform disposed on the plurality of sliding blocks, so that the at least one supporting platform slides relative to the base via the two linear guideways and the plurality of sliding blocks, and the at least one supporting platform being for supporting the at least one machine;
at least one accommodating slot structure disposed on the base and located between the two linear guideways;
a plurality of slabs detachably disposed on the at least one accommodating slot structure and separated from the at least one supporting platform, wherein support surfaces of the at least one supporting platform and the plurality of slabs are parallel with each other;
at least one concave directly disposed on one of the plurality of slabs; and
a positioning structure disposed on the at least one supporting platform, the positioning structure comprising:
a main body; and
a positioning protrusion movably disposed on the main body, the positioning protrusion being for engaging with the concave so as to constrain a movement of the at least one supporting platform relative to the plurality of slabs.

9. The supporting system of claim 8, wherein a height of the plurality of slabs is lower than a height of the at least one supporting platform.

10. The supporting system of claim 8, wherein the positioning structure further comprises a handle connected to the main body.

11. The supporting system of claim 8, wherein the base comprises a contacting component, the supporting platform comprises two constraining components, and the contacting component is for contacting against the two constraining components.

12. The supporting system of claim 8, further comprising:
a wiring channel disposed on a side of the supporting mechanism.

13. The supporting system of claim 12, further comprising:
a chain structure, two ends of the chain structure being respectively connected to the supporting platform and the wiring channel, an accommodating space being formed inside the chain structure.

14. The supporting system of claim 8, wherein the supporting mechanism further comprises:
a buffer disposed on an end of the linear guideway, the buffer being for providing cushioning function to the supporting platform.

15. The supporting system of claim 8, wherein the supporting mechanism further comprises:
a holding structure disposed on a side of the base, the holding structure being for holding the base; and
a fixing stand disposed between the linear guideway and the base, the fixing stand being for fixing the linear guideway.

16. The supporting system of claim 8, wherein the at least one machine is a server or a cooler.

17. A supporting mechanism comprising:
a base;
two linear guideways disposed on the base, each of the linear guideways having an upper contacting surface and a plurality of lateral contacting surfaces, the lateral contacting surfaces being connected to sides of the upper contacting surface;
a plurality of sliding blocks slidably disposed on the corresponding linear guideways, wherein each of the plurality of sliding blocks is a sunken structure, each sliding block being engaged with the corresponding linear guideway as inner walls of the corresponding sunken structure movably surround and contact the upper contacting surface and the plurality of lateral contacting surfaces of the corresponding linear guideway;
at least one supporting platform disposed on the plurality of sliding blocks, so that the at least one supporting platform slides relative to the base via the two linear guideways and the plurality of sliding blocks, and the at least one supporting platform being for supporting at least one machine;
at least one accommodating slot structure disposed on the base and located between the two linear guideways;
a plurality of slabs detachably disposed on the at least one accommodating slot structure and separated from the at least one supporting platform, wherein support surfaces of the at least one supporting platform and the plurality of slabs are parallel with each other;
at least one concave disposed on the base via a plate; and
a positioning structure disposed on the at least one supporting platform, the positioning structure comprising:
a main body; and
a positioning protrusion movably disposed on the main body, the positioning protrusion being for engaging with the concave so as to constrain the at least one supporting platform relative to the base.

18. The supporting mechanism of claim 17, wherein the positioning structure further comprises a handle connected to the main body.

* * * * *